US010547300B1

(12) United States Patent
Matsubara et al.

(10) Patent No.: US 10,547,300 B1
(45) Date of Patent: Jan. 28, 2020

(54) DRIVING DEVICE AND SWITCHING DEVICE

(71) Applicant: FUJI ELECTRIC CO., LTD., Kanagawa (JP)

(72) Inventors: Kunio Matsubara, Hino (JP); Tsuyoshi Nagano, Hino (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/429,092

(22) Filed: Jun. 3, 2019

(30) Foreign Application Priority Data

Jul. 25, 2018 (JP) ................................. 23018-139631

(51) Int. Cl.
| | | |
|---|---|---|
| H03K 17/04 | (2006.01) | |
| H03K 17/0412 | (2006.01) | |
| H03K 17/0814 | (2006.01) | |
| H03K 7/08 | (2006.01) | |
| G01R 19/165 | (2006.01) | |

(52) U.S. Cl.
CPC ..... H03K 17/04123 (2013.01); G01R 19/165 (2013.01); H03K 7/08 (2013.01); H03K 17/08142 (2013.01)

(58) Field of Classification Search
CPC ............... H03K 17/04123; H03K 7/08; H03K 17/08142; G01R 19/165
USPC ......................................................... 327/376
See application file for complete search history.

(56) References Cited

U.S. PATENT DOCUMENTS

| | | | | |
|---|---|---|---|---|
| 2004/0124923 | A1* | 7/2004 | Sato ....................... | H03G 3/007 330/285 |
| 2005/0213355 | A1* | 9/2005 | Koike ..................... | H02M 1/10 363/21.16 |
| 2005/0259448 | A1* | 11/2005 | Koike ............... | H02M 3/33523 363/21.01 |
| 2009/0057832 | A1 | 3/2009 | Kouno | |

(Continued)

FOREIGN PATENT DOCUMENTS

| | | |
|---|---|---|
| CN | 101414816 A | 4/2009 |
| CN | 105191133 A | 12/2015 |

(Continued)

OTHER PUBLICATIONS

Office Action issued for counterpart Japanese Application No. 2018-139631, issued by the Japan Patent Office dated Nov. 13, 2018 (drafted on Nov. 8, 2018).

(Continued)

*Primary Examiner* — Ryan Jager (57) ABSTRACT

A driving device is provided, which drives on/off a main switching element to which a diode is anti-parallel connected, wherein the driving device includes a detection unit configured to detect a voltage between a drain terminal and a source terminal; a determination unit configured to output a determination signal indicating whether a free wheeling current is flowing from the source terminal to the drain terminal based on a detected voltage detected by the detection unit; and a drive control unit configured to perform control such that the main switching element is set in an on-state on condition that an on command signal for turning on the main switching element is input and on condition that the determination signal indicating that the free wheeling current is flowing is output.

26 Claims, 4 Drawing Sheets

(56) References Cited

U.S. PATENT DOCUMENTS

| | | | |
|---|---|---|---|
| 2016/0036433 | A1 | 2/2016 | Toshiyuki |
| 2016/0241242 | A1 | 8/2016 | Toshiyuki |
| 2018/0316344 | A1* | 11/2018 | Matsubara ............. H03K 17/28 |
| 2019/0190511 | A1* | 6/2019 | Matsubara ......... H03K 17/0822 |

FOREIGN PATENT DOCUMENTS

| | | | |
|---|---|---|---|
| CN | 105897232 | A | 8/2016 |
| JP | 2009183017 | A | 8/2009 |
| JP | 5200559 | B2 | 6/2013 |
| JP | 2013187940 | A | 9/2013 |
| JP | 5939908 | B2 | 6/2016 |
| JP | 2016158478 | A | 9/2016 |
| JP | 2017051049 | A | 3/2017 |
| JP | 6168253 | B1 | 7/2017 |

OTHER PUBLICATIONS

Office Action issued for counterpart Japanese Application No. 2018-139631, issued by the Japan Patent Office dated Sep. 11, 2018 (drafted on Sep. 3, 2018).
Office Action issued for counterpart Chinese Application 201910445655.2, issued by The State Intellectual Property Office of People's Republic of China dated Oct. 30, 2019.

\* cited by examiner

DRIVING DEVICE AND SWITCHING DEVICE

BACKGROUND

1. Technical Field

The present invention relates to a driving device and a switching device.

2. Related Art

When the switching elements of the upper and lower arms are switched in the synchronous rectification system, the short-circuit of the upper and lower arms is prevented by providing a dead time between periods in which each arm is set in the on-state. However, during the dead time, the output voltage drops to cause losses. Therefore, a technology is proposed in which when the switching element of one arm is turned off, the switching element of the other arm is turned on in accordance with the fact that the free wheeling current is detected in the other arm to shorten the dead time, and the like (for example, see Patent Documents 1 to 3).

[Patent Document 1] Japanese Patent Application Publication No. 2016-158478
[Patent Document 2] Specification of Japanese Patent No. 5939908
[Patent Document 3] Japanese Patent Application Publication No. 2017-51049

However, if the free wheeling current is simply detected, there is a possibility that the discharge current from the parasitic capacitance of the switching element is erroneously detected as the free wheeling current and the upper and lower arms are short-circuited.

SUMMARY

In a first aspect of the present invention, there is provided a driving device that drives on/off a main switching element to which a diode is anti-parallel connected. The driving device may include a detection unit configured to detect a voltage between the drain terminal and the source terminal. The driving device may include a determination unit configured to output a determination signal indicating whether the free wheeling current is flowing from the source terminal to the drain terminal based on the detected voltage detected by the detection unit. The driving device may include a drive control unit configured to perform control such that the main switching element is set in the on-state on condition that the on command signal for turning on the main switching element is input, and the main switching element is set in the on-state on condition that the determination signal indicating that the free wheeling current is flowing is output.

The determination unit may compare the predetermined threshold voltage with the detected voltage to determine whether the free wheeling current is flowing. The threshold voltage may be 0 V.

In a second aspect of the present invention, there is provided a driving device that drives on/off a main switching element to which a diode is anti-parallel connected. The driving device may include a detection unit configured to detect current flowing from the source terminal to the drain terminal of the main switching element. The driving device may include a determination unit configured to output a determination signal indicating whether the free wheeling current is flowing from the source terminal to the drain terminal based on the detected current detected by the detection unit. The driving device may include a drive control unit configured to perform control such that the main switching element is set in the on-state on condition that the on command signal for turning on the main switching element is input, and the main switching element is set in the on-state on condition that the determination signal indicating that the free wheeling current is flowing is output.

The determination unit may compare the detected current with a predetermined threshold current to determine whether the free wheeling current is flowing.

The determination unit may compare the temporal change in the detected current with a predetermined value to determine whether the free wheeling current is flowing.

The determination unit may determine whether the free wheeling current is flowing to the main switching element when an opposite switching element connected in series to the main switching element is set in the off-state by an off command signal for turning off the opposite switching element.

The drive control unit may perform control such that a speed at which the main switching element is set in the on-state in accordance with the fact that it is determined that the free wheeling current is flowing is faster than a speed at which the main switching element is set in the on-state in accordance with the fact that the on command signal is input.

The drive control unit may include a gate resistor connected to a gate of the main switching element, and may perform control such that a resistance value of the gate resistor when the main switching element is set in the on-state in accordance with the fact that it is determined that the free wheeling current is flowing is smaller than a resistance value of the gate resistor when the main switching element is set in the on-state in accordance with the fact that the on command signal is input.

The driving device may further include a storage unit configured to store a time period from a time when an opposite switching element connected in series to the main switching element is set in the off-state to a time when it is determined by the determination unit that the free wheeling current is flowing. The determination unit may output, when the time period is stored, the determination signal indicating that the free wheeling current is flowing at a timing when the time has elapsed since the opposite switching element has been set in the off-state.

The on command signal may be set to drive the main switching element in the on-state by intervening a dead time in which both the main switching element and the opposite switching element connected in series to the main switching element are set in the off-state. The drive control unit may maintain the on-state of the main switching element by the determination signal until after the main switching element is set in the on-state by an on command signal for turning on the main switching element on condition that it is determined that the free wheeling current is flowing.

The driving device may include a pulse output unit configured to output a pulse signal having a predetermined time width on condition that a determination signal indicating that a free wheeling current is flowing is output.

The drive control unit may turn on the main switching element on condition that the pulse signal is output.

The time width of the pulse signal may be longer than the dead time and shorter than the time width in which the main switching element is maintained in the on-state by the subsequent on command signal.

In a third aspect of the present invention, a switching device is provided. The switching device may include the driving device of the first or second aspect. The switching device may include a main switching element whose gate is driven by a driving device.

The switching device may include a free wheeling diode that is anti-parallel connected to the main switching element.

The main switching element may be a wide bandgap semiconductor device. The free wheeling diode may be a parasitic diode of the main switching element.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention. It is to be noted that the same reference numerals are given to common configurations throughout the embodiments, and redundant explanations are omitted.

1. First Embodiment

Figure 1:
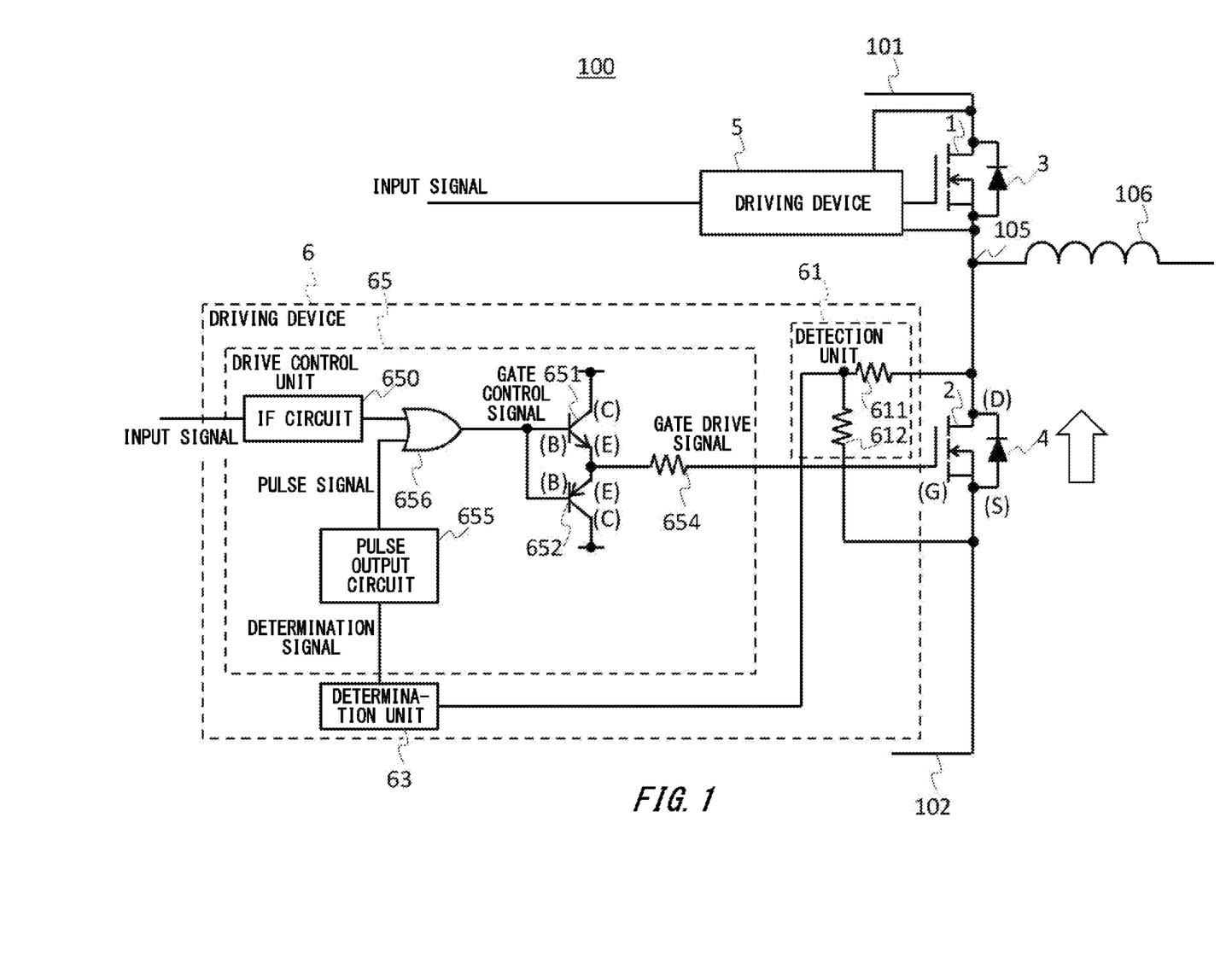
FIG. 1 shows a switching device according to a first embodiment.

FIG. 1 shows a switching device 100 according to the present embodiment.

The switching device 100 shows one phase of a power converter used for driving a motor or supplying electric power as one example, and outputs a converted voltage from a power supply output terminal 105 by switching the connection between a positive power supply line 101 and a negative power supply line 102, and the power supply output terminal 105.

Here, a DC voltage of, for example, 600 to 800 V is applied between the positive power supply line 101 and the negative power supply line 102, and the negative power supply line 102 is connected to the entire reference potential (ground potential, as one example) of the switching device 100. Also, an inductive load 106 is connected to the power supply output terminal 105. Switching device 100 includes a positive-side main switching element 1 and a negative-side main switching element 2, free wheeling diodes 3 and 4 that are anti-parallel connected to the main switching elements 1 and 2, a positive-side driving device 5, and a negative-side driving device 6.

[1-1. Main Switching Element]

The main switching elements 1 and 2 each electrically connect or disconnect the drain terminal and the source terminal. For example, the main switching elements 1 and 2 are switched on (also referred to as connection)/off (also referred to as disconnection) by driving devices 5 and 6 to be described later. Here, as one example, in the present embodiment, the main switching elements 1 and 2 are sequentially connected in series between the negative power supply line 102 and the positive power supply line 101 to constitute an upper arm and a lower arm in the power converter. The power supply output terminal 105 is connected to the middle point of the main switching elements 1 and 2.

The main switching elements 1 and 2 are silicon semiconductor devices using silicon as a base material. Instead of this, at least one of the main switching elements 1 and 2 may be a wide bandgap semiconductor device. A wide bandgap semiconductor device is a semiconductor device having a bandgap larger than that of a silicon semiconductor device, and is a semiconductor device including, for example, SiC, GaN, diamond, gallium nitride based material, gallium oxide based material, AlN, AlGaN, ZnO or the like. The wide bandgap semiconductor device can improve the switching speed more than a silicon semiconductor device. Note that in the present embodiment, the main switching elements 1 and 2 may be a Metal Oxide Semiconductor Field Effect Transistor (MOSFET), and the positive power supply line 101 side main switching element may have a parasitic diode (not shown), which is a cathode.

[1-2. Free Wheeling Diode]

The free wheeling diodes 3 and 4 are anti-parallel connected to the main switching elements 1 and 2.

The free wheeling diodes 3 and 4 may be Schottky barrier diodes, and may also be parasitic diodes of MOSFETs. The free wheeling diodes 3 and 4 may be silicon semiconductor devices, and may also be wide bandgap semiconductor devices.

[1-3. Driving Device]

The driving devices 5 and 6 drive the gates of the corresponding main switching elements 1 and 2 based on an input signal input from the outside. Here, the input signal is supplied from a signal source (not shown) to cause the main switching elements 1 and 2 to perform switching in a synchronous rectification system. For example, the input signal is set so as to alternatively turn on one of the main switching elements 1 and 2 (alternately as one example) by intervening a dead time in which both main switching elements 1 and 2 are set in the off-state (also referred to as a dead time of upper and lower arms). The dead time of the upper and lower arms is implemented by providing a period (also referred to as a dead time of the input signal) during which the input signal instructs the main switching elements 1 and 2 to respectively maintain the off-state. The input signal may control the main switching elements 1 and 2 by PWM control to output a substantially sinusoidal alternating current from the power supply output terminal 105. The input signal may be separately input to the main switching element 1 and the main switching element 2. Note that in the present embodiment, as one example, when the input signal is high (on command signal), the main switching element 2 is instructed to be in the on-state, and when the input signal is low (off command signal), the main switching element 2 is instructed to be set in the off-state.

The positive-side driving device 5 drives the gate of the main switching element 1, and the negative-side driving device 6 drives the gate of the main switching element 2. Here, among the main switching elements 1 and 2, an element connected in series to an object to be switched is also referred to as an opposite switching element. For example, with respect to the negative-side driving device 6, the main switching element 1 is the opposite switching element.

Note that since the driving devices 5 and 6 have the same configuration, the negative-side driving device 6 will be described in the present embodiment, and the description of the positive-side driving device 5 will be omitted. The driving device 6 includes a detection unit 61, a determination unit 63, and a drive control unit 65.

[1-3-1. Detection Unit]

The detection unit 61 detects a voltage between the drain terminal and the source terminal of the main switching element 2. For example, the detection unit 61 includes resistors 611 and 612 connected in series between the drain terminal and the source terminal and dividing the voltage between the drain terminal and the source terminal. The middle point of the resistors 611 and 612 is connected to the determination unit 63, and supplies the detected voltage to the determination unit 63.

[1-3-2. Determination Unit]

The determination unit 63 outputs a determination signal indicating whether the free wheeling current is flowing from the source terminal to the drain terminal based on the detected voltage detected by the detection unit 61. The determination unit 63 compares the predetermined threshold voltage with the detected voltage to determine whether the free wheeling current is flowing. For example, the determination unit 63 determines that the free wheeling current is flowing in accordance with the fact that the detected voltage is lower than the threshold voltage. This reliably detects that the free wheeling current is flowing. The threshold voltage is 0 V as one example, and in this case, it is determined that the free wheeling current is flowing in accordance with the fact that the potential of the source terminal is higher than the potential of the drain terminal. Note that in the present embodiment, for the detected voltage, a forward voltage of the free wheeling diode 4, that is, a voltage when the potential on the cathode is higher than that on the anode (see the hollow arrow in the figure), is regarded a positive voltage. The threshold voltage may also be a negative voltage smaller than 0 V, for example, may also be a negative voltage (−0.8 V) whose absolute value is larger than the threshold voltage (0.6 V as one example) of the free wheeling diode 4.

In the present embodiment, as one example, the determination unit 63 constantly performs the determination.

Further, the determination unit 63 supplies to the drive control unit 65 a determination signal that is continuously high when it is determined that the free wheeling current is flowing.

[1-3-3. Drive Control Unit]

The drive control unit 65 controls the main switching element 2, and, for example, performs control such that the main switching element 2 is set in the on-state on condition that a determination signal indicating that a free wheeling current is flowing is output, and on condition that an on command signal is input to the main switching element 2. In the present embodiment, as one example, the drive control unit 65 performs control such that the main switching element 2 is set in the on-state on condition that the determination signal is high when the main switching element 1 on the opposite side is set in the off-state, and on condition that the on command signal is input to the main switching element 2. The drive control unit 65 includes a first switching element 651, a second switching element 652, a gate resistor 654, an interface (IF) circuit 650, a pulse output circuit 655, and an OR circuit 656.

[1-3-3 (1). First Switching Element, Second Switching Element]

The first switching element 651 and the second switching element 652 supply a gate drive signal (on command signal/ off command signal) for instructing the gate terminal of the main switching element 2 to turn on/off.

For example, the first switching element 651 is connected in series with the gate resistor 654 between the first potential (20 V as one example) higher than the reference potential of the negative power supply line 102 and the gate terminal of the main switching element 2. Accordingly, when the first switching element 651 is turned on, the gate drive signal that drives the gate of the main switching element 2 is high, and the main switching element 2 is turned on. In the present embodiment, as one example, the first switching element 651 is an NPN type bipolar transistor, wherein the collector terminal is connected to the first potential, the emitter terminal is connected to the gate terminal of the main switching element 2, and the base terminal is connected to the IF circuit 650 (the OR circuit 656 as one example in the present embodiment). Accordingly, the first switching element 651 is set in the on-state when the input gate drive signal is high.

The second switching element 652 is connected in series with the gate resistor 654 between the second potential (−5 V as one example) lower than the reference potential and the gate terminal of the main switching element 2. Accordingly, when the second switching element 652 is turned on, the gate drive signal is low, and the main switching element 2 is turned off. In the present embodiment, as one example, the second switching element 652 is a PNP type bipolar transistor, wherein the collector terminal is connected to the second potential, and the emitter terminal is connected to the gate terminal of the main switching element 2, and the base terminal is connected to the IF circuit 650 (the OR circuit 656 as one example in the present embodiment). Accordingly, the second switching element 652 is set in the on-state when the input gate drive signal is low.

Note that the first switching element 651 and the second switching element 652 are not limited to bipolar transistors, and may also be a semiconductor device of another structure such as a MOSFET.

[1-3-3 (2). Gate Resistor]

The gate resistor 654 is connected to the gate terminal of the main switching element 2. Note that in the present embodiment, as one example, the gate resistor 654 is disposed between the middle point of the first switching element 651 and the second switching element 652 and the gate terminal of the main switching element 2, but may be disposed on the collector terminal side of each of the first switching element 651 and the second switching element 652.

[1-3-3 (3). IF Circuit]

The IF circuit 650 receives an input signal from the outside of the driving device 6. In the present embodiment, as one example, the IF circuit 650 supplies an input signal to the OR circuit 656.

[1-3-3 (4). Pulse Output Circuit]

The pulse output circuit 655 supplies to the first switching element 651 a pulse signal that is high on condition that the determination unit 63 determines that the free wheeling current is flowing. In the present embodiment, as one example, the pulse output circuit 655 may output a pulse signal with an edge where the determination signal is high as a trigger. The pulse output circuit 655 supplies a pulse signal to the base terminal of the first switching element 651 via the OR circuit 656.

The pulse output circuit 655 may distinguish the dead time starting when the main switching element 1 is set in the off-state, and the dead time starting when main switching element 2 is set in the off-state by latching the rising edge (on command signal) and the falling edge (off command signal) of the input signal, and may output a pulse signal when the determination signal is high at the dead time when main switching element 1 is set in the off-state.

[1-3-3 (5). OR Circuit]

OR circuit 656 has an input terminal connected to the IF circuit 650 and the pulse output circuit 655, and an output terminal connected to the base terminals of each of the first switching element 651 and the second switching element 652. Accordingly, the OR circuit 656 supplies a gate control signal indicative of a logical sum of the input signal to the main switching element 2 and the pulse signal from the pulse output circuit 655 to the first switching element 651 and the second switching element 652, and outputs the gate drive signal to the gate terminal of the main switching element 2. As a result, the gate control signal and the gate drive signal are high on condition that at least one of the case where the main switching element 2 is instructed to be turned on by the input signal, and the case where it is determined that the free wheeling current is flowing (in the present embodiment, the pulse signal is rising) is satisfied, and the main switching element 2 is set in the on-state. In addition, the gate control signal and the gate drive signal are low on condition that the main switching element 2 is instructed to be turned off by the input signal, and the determination signal indicating that the free wheeling current is flowing is not output (as one example, the pulse signal is falling), and the main switching element 2 is set in the off-state.

According to the above switching device 100, it is determined whether the free wheeling current is flowing based on the detected voltage between the drain terminal and the source terminal of the main switching element 2, so that the present embodiment is different from the case where the current from the source terminal to the drain terminal is detected to simply determine whether the free wheeling current is flowing, and it is possible to prevent the erroneous determination that the free wheeling current is flowing due to the generation of the discharge current of the parasitic capacitance of the main switching element 2. Therefore, since the main switching element 2 can be is set in the on-state in a state in which the free wheeling current is flowing reliably, it is possible to prevent the upper and lower arms from being short-circuited by the main switching elements 1 and 2 being simultaneously set in the on-state. In addition, since the main switching element 2 is set in the on-state on condition that it is determined that the free wheeling current is flowing, and on condition that the on command signal is input, it is possible to shorten the actual dead time, compared with the case where the main switching element 2 is set in the on-state only on condition that the on command signal is input, that is, the case where the main switching element 2 is set in the on-state after the elapse of the dead time set by the input signal. Therefore, the loss due to the voltage drop during the dead time period can be reduced. In addition, the time during which the free wheeling current flows can be shortened, and the deterioration and destruction of the free wheeling diode can be prevented.

In addition, since the main switching element 2 is set in the on-state on condition that the pulse signal, which is high under a condition that it is determined that the free wheeling current is flowing, is output, it is possible to prevent the main switching element 2 in the on-state from being set in the off-state before it is set in the on-state by the on command signal.

Further, the main switching element 2 is set in the on-state on condition that the determination signal is high when the main switching element 1 on the opposite side is set in the disconnected state, so that it is possible to prevent the main switching element 2 from being turned on again because the determination signal is high in the dead time when the main switching element 2 is set in the off-state, thereby preventing the short-circuit of the upper and lower arms.

[1-4. Operation Mode]

Figure 2:
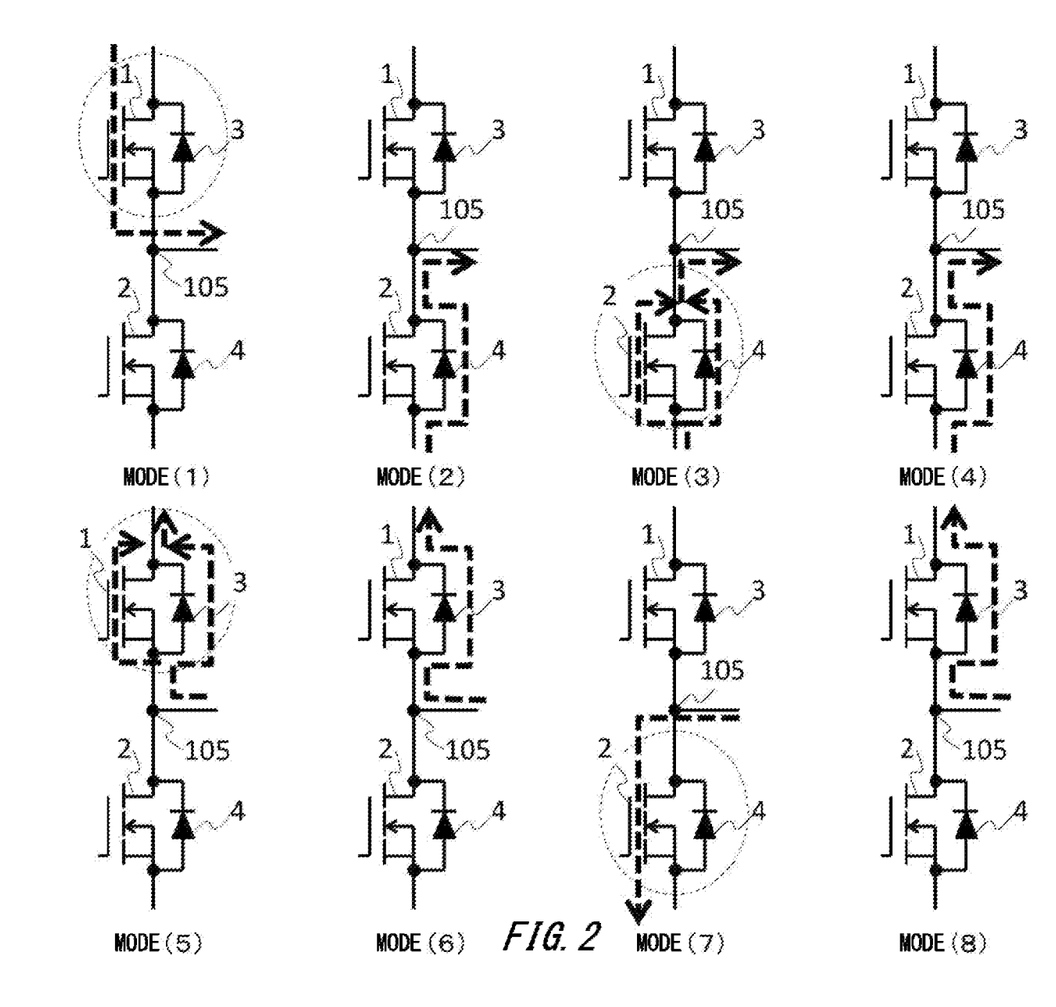
FIG. 2 shows an operation mode of the switching device.

FIG. 2 shows an operation mode of the switching device 100 of the present embodiment. In the figure, arrows of broken lines indicate the flow of current, and the circle of the broken line indicate an element in the on-state (connected state) of the main switching elements 1 and 2. The switching device 100 can take eight operation modes (1) to (8) depending on the on/off-states of the main switching elements 1 and 2, and the direction of the current.

The operation modes (1) to (4) are modes when the output current from the power supply output terminal 105 is positive, and repeat the transition in this order when the main switching elements 1 and 2 are alternately turned on by intervening a dead time. For example, in the operation mode (1), as a result of the main switching element 1 of the upper arm being turned on, positive current flows to the power supply output terminal 105 through the main switching element 1. The operation mode (2) is a dead time in which the main switching element 1 is turned off, and the main switching elements 1 and 2 are both in the off-state, and the current change from the operation mode (1) is prevented due to a self-induction action of the inductive load 106. As a result, positive current flows to the power supply output terminal 105 through the free wheeling diode 4 of the lower arm. In the operation mode (3), as a result of the main switching element 2 being turned on, a positive current flows to the power supply output terminal 105 through the main switching element 2 and the free wheeling diode 4. The operation mode (4) is a dead time in which the main switching element 2 is turned off, and positive current flows to the power supply output terminal 105 through the free wheeling diode 4 as in the operation mode (2). In this manner, in the operation modes (1) to (4), the lower arm is located on the free wheeling side, and free wheeling current flows to the free wheeling diode 4 of the lower arm.

Similarly, the operation modes (5) to (8) are modes when the output current from the power supply output terminal 105 is negative, and repeat the transition in this order when the main switching elements 1 and 2 are alternately turned on by intervening a dead time. For example, in the operation mode (5), the main switching element 1 of the upper arm is turned on, and as a result, negative current flows to the power supply output terminal 105 through the main switching element 1 and the free wheeling diode 3. The operation mode (6) is a dead time in which the main switching element 1 is turned off, and as a result of the current change from the operation mode (5) being prevented by the self-induction action of the inductive load 106, negative current flows to the power supply output terminal 105 through the free wheeling diode 3 of the upper arm. In the operation mode (7), as a result of the main switching element 2 of the lower arm being turned on, a negative current flows to the power supply output terminal 105 through the main switching element 2. The operation mode (8) is a dead time in which the main switching element 2 is turned off, and negative current flows to the power supply output terminal 105 through the free wheeling diode 3 as in the operation mode (6). In this manner, in the operation modes (5) to (8), the upper arm is located on the free wheeling side, and the free wheeling current flows to the free wheeling diode 3 of the upper arm.

[1-5. Operation Waveform]

Figure 3:
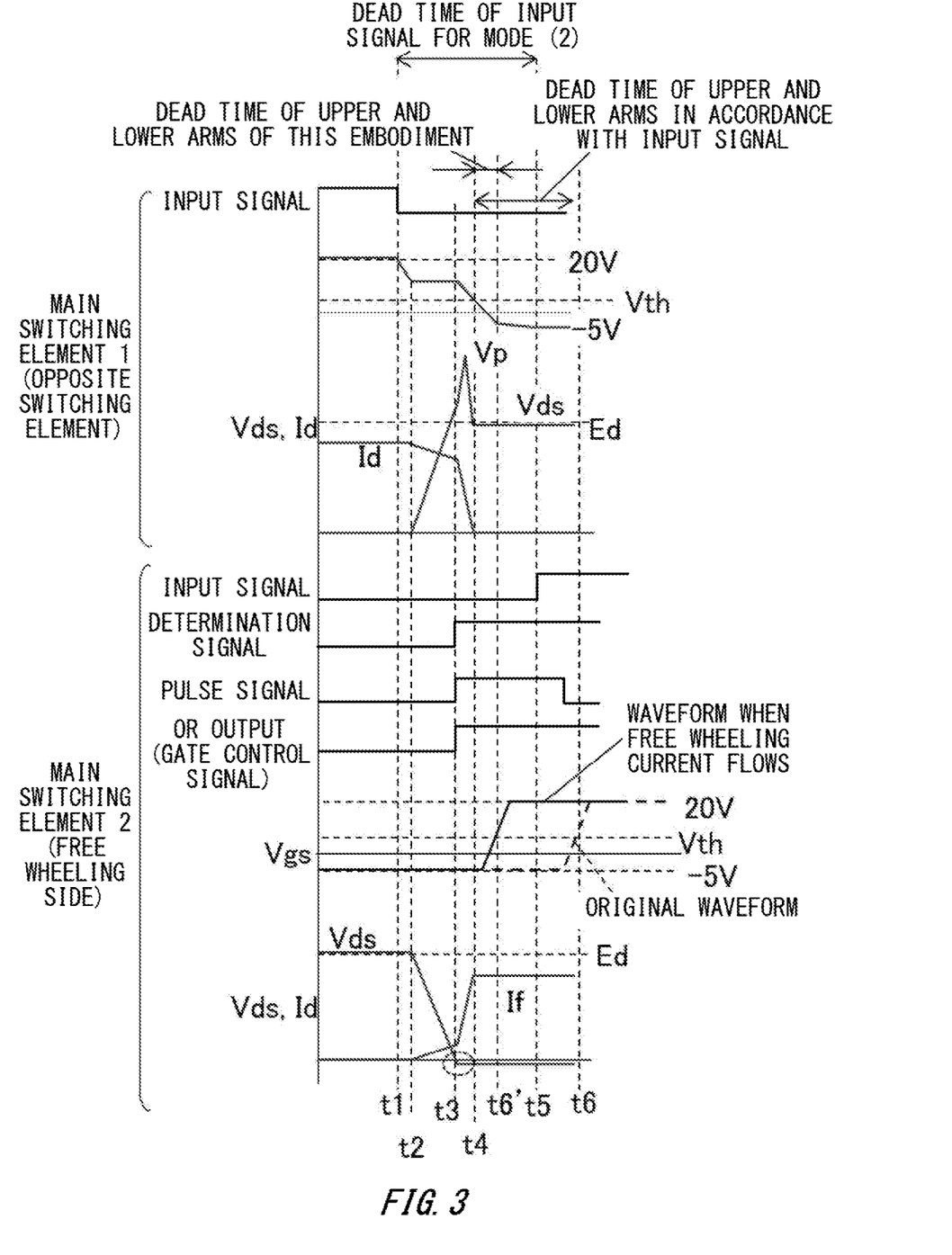
FIG. 3 shows an operation waveform of the switching device of the first embodiment.

FIG. 3 shows an operation waveform of the switching device 100 of the present embodiment. In this example, operation waveforms at the time of transition of the above-described operation modes (1) to (3) are shown. That is, after the input signal (off command signal) to be turned off at time t1 is supplied to the main switching element 1 which is the opposite side switching element, an input signal (on command signal) to be turned on at time t5 is supplied to the main switching element 2 which is located on the free wheeling side by intervening the dead time of the input signal in the period from time t1 to t5. Note that the same applies to the operation waveforms at the time of transition of the operation modes (7), (8), and (5). Also, the horizontal axis in the figure indicates time, and the vertical axis indicates input signals of the main switching elements 1 and 2, a gate-to-source voltage Vgs, a drain-to-source voltage Vds, a drain current Id, a free wheeling current If and the like. Further, "Ed" in the figure indicates a DC voltage between the positive power supply line 101 and the negative power supply line 102.

First, when the input signal to the main switching element 1 switches from high (on command) to low (off command) at time t1, the gate-to-source voltage $Vgs_{(1)}$ decreases, and the turn-off operation starts. Subsequently, when the gate-to-source voltage $Vgs_{(1)}$ decreases to the Miller voltage (at time t2), the change in the gate-to-source voltage $Vgs_{(1)}$ is flat (so-called Miller period), the drain-to-source voltage $Vds_{(1)}$ of the main switching element 1 increases, and the drain current $Id_{(1)}$ decreases. On the other hand, the drain-to-source voltage $Vds_{(2)}$ decreases in the main switching element 2, and the free wheeling current $If_{(2)}$ passing through the free wheeling diode 4 increases.

Next, when the drain-to-source voltage $Vds_{(2)}$ of the main switching element 2 is zero at time t3, the Miller period ends in the main switching element 1, and the drain current $Id_{(1)}$ sharply decreases (will be zero at time t4). In addition, after the drain-to-source voltage $Vds_{(1)}$ increases to the peak voltage Vp, it decreases to the DC voltage Ed between the positive power supply line 101 and the negative power supply line 102 at time t4, and the gate-to-source voltage $Vgs_{(1)}$ falls below the gate threshold voltage Vth.

Accordingly, the operation mode shifts from mode (1) to mode (2).

On the other hand, in the main switching element 2, the free wheeling current If flowing to the free wheeling diode 4 increases and the free wheeling mode is started. A forward voltage of the free wheeling diode 4 is generated at both ends of the main switching element 2, and the drain-to-source voltage $Vds_{(2)}$ further decreases to be a negative voltage (negative polarity) (see the circle of the broken line in the figure). Accordingly, the determination unit 63 determines that the drain-to-source voltage $Vds_{(2)}$ is less than the threshold voltage (0 V as one example), that is, the free wheeling current is flowing, and the determination signal is high.

When the determination signal is high, the pulse output circuit 655 supplies a high pulse signal to the OR circuit 656. As a result, the gate control signal to the main switching element 2 is high regardless of the state of the input signal to the main switching element 2. As a result, the gate-to-source voltage $Vgs_{(2)}$ of the main switching element 2 rises and exceeds the gate threshold voltage Vth at time t6', so that the operation mode shifts from mode (2) to mode (3) (see "the waveform when free wheeling current flows" in the figure). On the other hand, when the gate-to-source voltage $Vgs_{(2)}$ rises in accordance with the fact that the input signal is high at time t5, the gate-to-source voltage $Vgs_{(2)}$ exceeds the gate threshold voltage at time t6 after time t5, t6', and the operation mode shifts from mode (2) to mode (3) (see "the original waveform" in the figure). Therefore, according to the present embodiment, the actual dead time of the upper and lower arms is shorter than the dead time of the upper and lower arms in accordance with the input signal. Here, the time width of the pulse signal may be a predetermined fixed length, and may have a pulse width longer than the dead time. Accordingly, the on-state of the main switching element 2 caused by the flow of the free wheeling current is maintained until the time when the main switching element 2 is set in the on-state by the input signal, for example, until after time t6. In addition, the time width of the pulse signal may be shorter than the time width in which the main switching element 2 is maintained in the on-state by the subsequent on command signal. This prevents the main switching element 2 from being maintained in the on-state after the input signal is low (off command signal).

According to the above operation, when it is determined that the free wheeling current is flowing, the determination signal is high and the pulse signal is output, and the main switching element 2 is set in the on-state on condition of the pulse signal, so that even if the free wheeling current continues to flow, the main switching element 2 may be set in the off-state by the falling of the pulse signal. Therefore, when the free wheeling current continues to flow, it is possible to prevent the upper and lower arms from being short-circuited by the main switching element 2 which has been turned off being turned on again soon.

In addition, since the main switching element 2 is maintained in the on-state until after time t6 when the main switching element 2 is set in the on-state by the input signal, so that it is possible to prevent the main switching element 2 from returning to the off-state before time t6 after the main switching element 2 is turned on by the flow of the free wheeling current.

2. Second Embodiment

Figure 4:
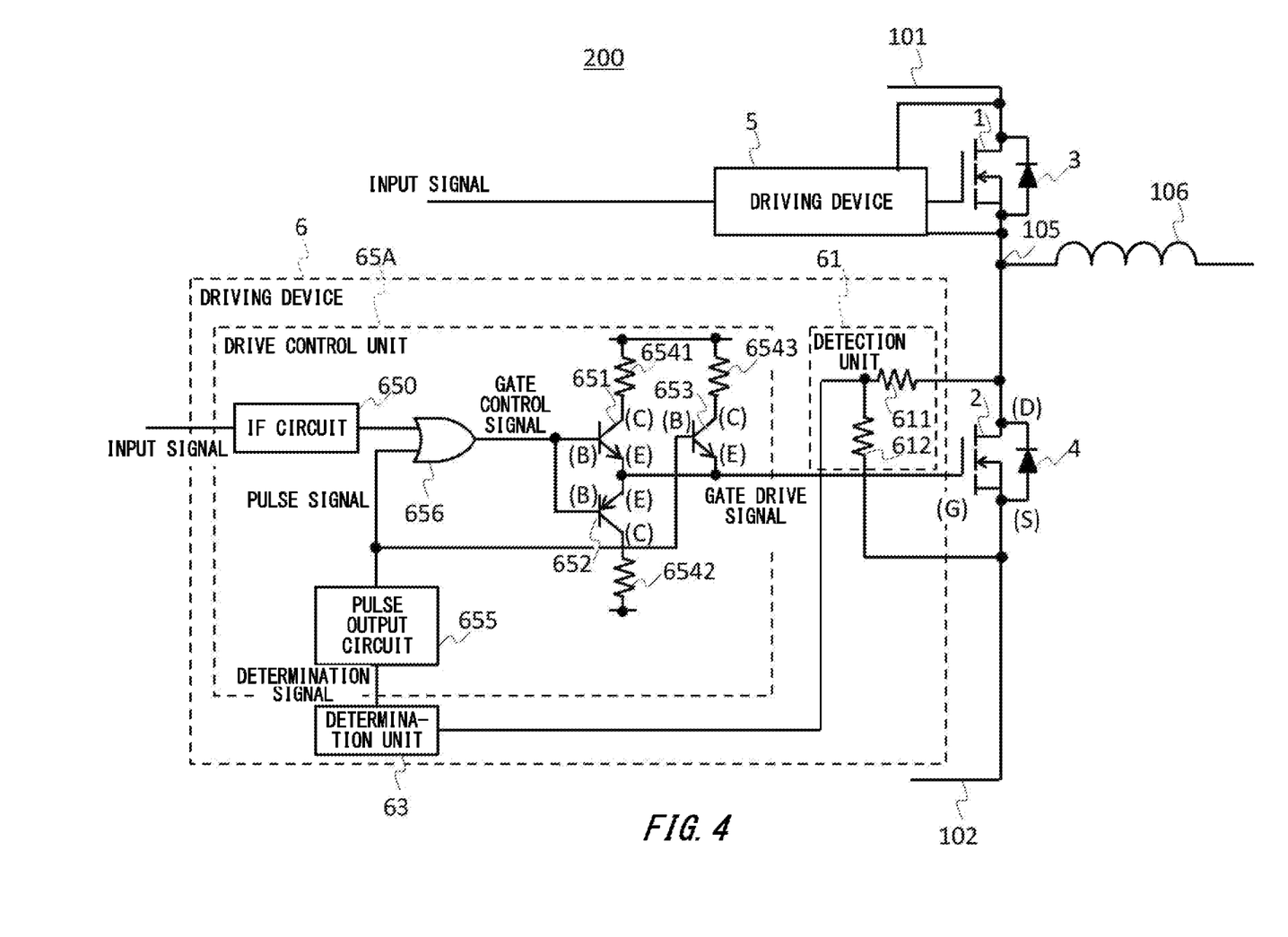
FIG. 4 shows a switching device according to a second embodiment.

FIG. 4 shows a switching device 200 according to the present embodiment. A drive control unit 65A of the switching device 200 includes a third switching element 653 and gate resistors 6541 to 6543.

The third switching element 653 is connected in parallel to the first switching element 651 between the first potential (20 V as one example) and the gate terminal of the main switching element 2. Accordingly, when the third switching element 653 is turned on, the gate drive signal is high and the main switching element 2 is turned on. In the present embodiment, as one example, the third switching element 653 is an NPN type bipolar transistor, wherein the collector terminal is connected to the first potential, the emitter terminal is connected to the gate terminal of the main switching element 2, and the base terminal is connected to the pulse output circuit 655. Accordingly, the third switching element 653 sets the gate drive signal to be high to turn on the main switching element 2 on condition that it is determined that the free wheeling current is flowing. Note that the third switching element 653 is not limited to a bipolar transistor, and may be a semiconductor device of another structure such as a MOSFET.

The gate resistor 6542 is connected in series with the second switching element 652 between the second potential and the gate terminal of the main switching element 2. Note that in the present embodiment, as one example, the gate resistor 6542 is disposed on the collector terminal of the second switching element 652, but may also be disposed on the emitter terminal.

The gate resistor 6541 is connected in series with the first switching element 651 between the first potential and the gate terminal of the main switching element 2. Note that in the present embodiment, as one example, the gate resistor 6541 is disposed on the collector terminal of the first switching element 651, but may also be disposed on the emitter terminal.

The gate resistor 6543 is connected in series with the third switching element 653 between the first potential and the gate terminal of the main switching element 2. Note that in the present embodiment, as one example, the gate resistor 6543 is disposed on the collector terminal of the third switching element 653, but may also be disposed on the emitter terminal.

Here, the gate resistors 6541 and 6543 are selectively used depending on when the input signal is high (on command signal) or when the pulse signal is high. In the present embodiment, as one example, when the input signal is high, the gate resistor 6541 is used since the first switching element 651 is turned on, and when the pulse signal is high, the gate resistor 6541 and the gate resistor 6543 are used in combination since the first switching element 651 and the third switching element 653 are turned on. The combined resistance value R of the resistance value R1 of the gate resistor 6541 and the resistance value R3 of the gate resistor 6543 is, as represented by the following equation (1), is set to a value smaller than the resistance value R1 of the gate resistor 6541 when the main switching element 2 is set in the on-state in accordance with the fact that the input signal is high.

$$R=1/(1/R1+1/R3)<R1 \quad (1)$$

Accordingly, the resistance value R when the main switching element 2 is set in the on-state in accordance with the fact that it is determined that the free wheeling current is flowing is smaller than resistance value R1 when that main switching element 2 is set in the on-state in accordance with the fact that the on command signal is input. Therefore, the speed at which the pulse signal is high and the main switching element 2 is set in the on-state is faster than the speed at which the input signal is high and the main switching element 2 is set in the on-state.

According to the switching device 200 described above, the speed at which the main switching element 2 is set in the on-state by the determination that the free wheeling current is flowing is faster than the speed at which the main switching element 2 is set in the on-state by the input signal, so that the dead time of the upper and lower arms can be further shortened.

Note that in the above-described second embodiment, the gate resistor 6541 is used alone when the input signal is high, and the gate resistors 6541 and 6543 are combined and used when the pulse signal is high. However, the gate resistor 6543 may be used alone when the pulse signal is high. In this case, the resistance value of the gate resistor 6543 is set smaller than the resistance value of the gate resistor 6541. Further, instead of switching the resistance value selectively using the plurality of gate resistors 6541 and 6543, the drive control unit 65A may change the resistance value using a variable resistor as the gate resistor. Further, instead of changing the resistance value of the gate resistor to increase the switching speed of the main switching element 2, the drive control unit 65A may increase the switching speed by raising the first potential.

Also, in the above-described first and second embodiments, the drive control unit 65, 65A is described as turning on the main switching element 2 on condition that it is determined that the free wheeling current is flowing. The main switching element 2 may be is set in the on-state on condition that the free wheeling current is flowing and the main switching element 1 is set in the off-state. In this case, a short-circuit between the upper and lower arms can be prevented more reliably.

Further, although the detection unit 61 has been described as detecting the voltage between the drain terminal and the source terminal, it may detect current flowing from the source terminal to the drain terminal. The detection unit 61 may be a current transformer, or may be a current sense integrally provided in the switching element 2. When the detection unit 61 detects current flowing from the source terminal toward the drain terminal, the determination unit 63 may determine whether the free wheeling current is flowing based on the current detected by the detection unit 61. For example, the determination unit 63 may also compare the predetermined threshold current with the detected current to determine whether the free wheeling current is flowing, or may compare the predetermined threshold change rate with the temporal change rate of the detected current to determine whether the free wheeling current is flowing. The threshold current may be, for example, current flowing through the free wheeling diode 4 when the main switching element 2 is turned on and the drain-to-source voltage $Vds_{(2)}$ is zero (see time t3 in FIG. 3), or may be current whose absolute value is larger than that of the above current. The threshold current may be current with a value larger than the maximum value of the discharge current of the parasitic capacitance of the main switching element 2. Further, the threshold change rate may be, for example, a change rate of the current flowing through the free wheeling diode 4 at the time when the main switching element 2 is turned on and the drain-to-source voltage $Vds_{(2)}$ is zero (see the time t3 in FIG. 3), or may be larger than the above change rate. In these cases as well, unlike the case where it is simply determined whether the free wheeling current is flowing, it is possible to prevent the erroneous determination that the free wheeling current is flowing due to the generation of the discharge current of the parasitic capacitance of the main switching element 2, and it is possible to prevent the upper and lower arms from being short-circuited.

In addition, although determination unit 63 is described as outputting a determination signal indicating whether the free wheeling current is flowing based on the voltage or the current detected by the detection unit 61, the determination signal may be output without using the detected voltage and the detected current in part of the turn-on control among the control at each time at which the main switching element 2 is turned on. For example, the driving device 6 may also further include a storage unit (not shown) configured to store an elapsed time period from a time when the opposite switching element 1 is set in the off-state (from a time when the off command signal is input to the opposite switching element 1 as one example) to a time when the determination unit 63 determines that the free wheeling current is flowing. When the elapsed time period is stored, the determination unit 63 may also output a determination signal indicating that the free wheeling current is flowing at timing when the elapsed time has elapsed since the opposite switching element 1 has been set in the off-state. Accordingly, even when the switching cycle is short, the actual dead time can be shortened. As one example, the determination unit 63 may output the determination signal using the elapsed time period in each turn-on control after the elapsed time period is stored in the storage unit. Further, the determination unit 63 may also determine presence or absence of the free wheeling current based on the detected voltage or the detected current in parallel with outputting the determination signal using the elapsed time period, and sequentially update the elapsed time period stored in the storage unit. Instead of this, the determination unit 63 may also output a determination signal based on the detected voltage or the detected current for each of a plurality of turn-on controls or for each passage of a reference time period without using the stored elapsed time period, and update the elapsed time period stored in the storage unit.

Also, the drive control unit 65, 65A may also turn on the main switching element 2 independently by each of the input signal and the determination signal without having the OR circuit 656 and the pulse output circuit 655. According to such a configuration, it is possible to prevent the upper and lower arms from being short-circuited by the main switching element 2 which has been turned off being turned on again.

Further, although the determination unit 63 has been described as performing the determination constantly, it may perform the determination at a dead time when the main switching element 1 is set in the off-state by the input signal. In this case, the determination unit 63 may distinguish the dead time starting when the main switching elements 1 and 2 are set in the off-state by latching the rising edge and the falling edge of the input signal.

Further, although the pulse output circuit 655 has been described as outputting a pulse signal having a fixed pulse width, it may output a pulse signal having a variable pulse width. For example, the pulse output circuit 655 may output a pulse signal that continues to be high until any time when an on command signal is input to the main switching element 2 after the determination unit 63 determines that the free wheeling current is flowing. Accordingly, it is possible to reliably prevent the main switching element 2 from returning to the off-state before the on command signal is input after the main switching element 2 is turned on by the flow of the free wheeling current.

In addition, although the switching device 100, 200 has been described as including the set of the positive-side main switching element 1 and the positive-side driving device 5, and the set of the negative-side main switching element 2 and the negative-side driving device 6, it may have only one of the sets.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A driving device that drives on/off a main switching element to which a diode is anti-parallel connected, the driving device comprising:

a detection unit configured to detect a voltage between a drain terminal and a source terminal;

a determination unit configured to output a determination signal indicating whether free wheeling current is flowing from the source terminal to the drain terminal based on a detected voltage detected by the detection unit; and a drive control unit configured to perform control such that the main switching element is set in an on-state on condition that an on command signal for turning on the main switching element is input, and the main switching element is set in an on-state on condition that the determination signal indicating that the free wheeling current is flowing is output.

2. The driving device according to claim 1, wherein the determination unit compares the detected voltage with a predetermined threshold voltage to determine whether the free wheeling current is flowing.

3. The driving device according to claim 2, wherein the threshold voltage is 0 V.

4. The driving device according to claim 1, wherein the determination unit determines whether the free wheeling current is flowing to the main switching element when an opposite switching element connected in series to the main switching element is set in an off-state by an off command signal for turning off the opposite switching element.

5. The driving device according to claim 1, wherein the drive control unit performs control such that a speed at which the main switching element is set in an on-state in accordance with a fact that it is determined that the free wheeling current is flowing is faster than a speed at which the main switching element is set in an on-state in accordance with a fact that the on command signal is input.

6. The driving device according to claim 5, wherein the drive control unit includes a gate resistor connected to a gate of the main switching element, and performs control such that a resistance value of the gate resistor when the main switching element is set in an on-state in accordance with a fact that it is determined that the free wheeling current is flowing is smaller than a resistance value of the gate resistor when the main switching element is set in an on-state in accordance with a fact that the on command signal is input.

7. The driving device according to claim 1, further comprising:

a storage unit configured to store a time period from a time when an opposite switching element connected in series to the main switching element is set in an off-state to a time when it is determined by the determination unit that the free wheeling current is flowing, wherein the determination unit outputs, when the time period is stored, the determination signal indicating that the free wheeling current is flowing at a timing when the time period has elapsed since the opposite switching element has been set in an off-state.

8. The driving device according to claim 1, wherein the on command signal is set to drive the main switching element in an on-state by intervening a dead time in which both the main switching element and an opposite switching element connected in series to the main switching element are set in an off-state, wherein the drive control unit maintains an on-state of the main switching element by the determination signal until after the main switching element is set in an on-state by an on command signal for turning on the main switching element on condition that it is determined that the free wheeling current is flowing.

9. The driving device according to claim 8, further comprising a pulse output unit configured to output a pulse signal having a predetermined time width on condition that the determination signal indicating that the free wheeling current is flowing is output, wherein the drive control unit performs control such that the main switching element is set in an on-state on condition that the pulse signal is output.

10. The driving device according to claim 9, wherein a time width of the pulse signal is longer than the dead time and shorter than a time width in which the main switching element is maintained in an on-state by a subsequent on command signal.

11. A switching device comprising:
the driving device according to claim 1;
the main switching element whose gate is driven by the driving device; and
a free wheeling diode that is anti-parallel connected to the main switching element.

12. The switching device according to claim 11, wherein the main switching element is a wide bandgap semiconductor device.

13. The switching device according to claim 11, wherein the free wheeling diode is a parasitic diode of the main switching element.

14. A driving device that drives on/off a main switching element to which a diode is anti-parallel connected, the driving device comprising:
a detection unit configured to detect current flowing from a source terminal to a drain terminal of the main switching element;
a determination unit configured to output a determination signal indicating whether free wheeling current is flowing from the source terminal to the drain terminal based on detected current detected by the detection unit; and
a drive control unit configured to perform control such that the main switching element is set in an on-state on condition that an on command signal for turning on the main switching element is input, and the main switching element is set in an on-state on condition that the determination signal indicating that the free wheeling current is flowing is output.

15. The driving device according to claim 14, wherein the determination unit compares the detected current with predetermined threshold current to determine whether the free wheeling current is flowing.

16. The driving device according to claim 15, wherein the determination unit compares a temporal change in the detected current with a predetermined value to determine whether the free wheeling current is flowing.

17. The driving device according to claim 14, wherein the determination unit determines whether the free wheeling current is flowing to the main switching element when an opposite switching element connected in series to the main switching element is set in an off-state by an off command signal for turning off the opposite switching element.

18. The driving device according to claim 14, wherein the drive control unit performs control such that a speed at which the main switching element is set in an on-state in accordance with a fact that it is determined that the free wheeling current is flowing is faster than a speed at which the main switching element is set in an on-state in accordance with a fact that the on command signal is input.

19. The driving device according to claim 18, wherein the drive control unit includes a gate resistor connected to a gate of the main switching element, and performs control such that a resistance value of the gate resistor when the main switching element is set in an on-state in accordance with a fact that it is determined that the free wheeling current is flowing is smaller than a resistance value of the gate resistor when the main switching element is set in an on-state in accordance with a fact that the on command signal is input.

20. The driving device according to claim 14, further comprising:
a storage unit configured to store a time period from a time when an opposite switching element connected in series to the main switching element is set in an off-state to a time when it is determined by the determination unit that the free wheeling current is flowing,
wherein the determination unit outputs, when the time period is stored, the determination signal indicating that the free wheeling current is flowing at a timing when the time period has elapsed since the opposite switching element has been set in an off-state.

21. The driving device according to claim 14,
wherein the on command signal is set to drive the main switching element in an on-state by intervening a dead time in which both the main switching element and an opposite switching element connected in series to the main switching element are set in an off-state,
wherein the drive control unit maintains an on-state of the main switching element by the determination signal until after the main switching element is set in an on-state by an on command signal for turning on the main switching element on condition that it is determined that the free wheeling current is flowing.

22. The driving device according to claim 21, further comprising a pulse output unit configured to output a pulse signal having a predetermined time width on condition that the determination signal indicating that the free wheeling current is flowing is output, wherein the drive control unit performs control such that the main switching element is set in an on-state on condition that the pulse signal is output.

23. The driving device according to claim 22, wherein a time width of the pulse signal is longer than the dead time and shorter than a time width in which the main switching element is maintained in an on-state by a subsequent on command signal.

24. A switching device comprising:
the driving device according to claim 14;
the main switching element whose gate is driven by the driving device; and
a free wheeling diode that is anti-parallel connected to the main switching element.

25. The switching device according to claim 24, wherein the main switching element is a wide bandgap semiconductor device.

26. The switching device according to claim 24, wherein the free wheeling diode is a parasitic diode of the main switching element.

* * * * *

UNITED STATES PATENT AND TRADEMARK OFFICE
CERTIFICATE OF CORRECTION

PATENT NO. : 10,547,300 B1
APPLICATION NO. : 16/429092
DATED : January 28, 2020
INVENTOR(S) : Matsubara et al.

Page 1 of 1

It is certified that error appears in the above-identified patent and that said Letters Patent is hereby corrected as shown below:

On the Title Page

Item (30), should read as follows:
(30) Foreign Application Priority Data
Jul. 25, 2018 (JP) ........................ 2018-139631

Signed and Sealed this
Twenty-eighth Day of April, 2020

Andrei Iancu
*Director of the United States Patent and Trademark Office*